(12) United States Patent
Gao

(10) Patent No.: US 11,284,543 B2
(45) Date of Patent: Mar. 22, 2022

(54) DATA CENTER POINT OF DELIVERY LAYOUT AND CONFIGURATIONS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/880,343

(22) Filed: May 21, 2020

(65) Prior Publication Data

US 2021/0368655 A1 Nov. 25, 2021

(51) Int. Cl.
*H05K 7/20* (2006.01)

(52) U.S. Cl.
CPC ..... *H05K 7/20827* (2013.01); *H05K 7/20136* (2013.01); *H05K 7/20209* (2013.01); *H05K 7/20327* (2013.01); *H05K 7/20509* (2013.01); *H05K 7/20745* (2013.01); *H05K 7/20836* (2013.01)

(58) Field of Classification Search
CPC ........... H05K 7/20827; H05K 7/20136; H05K 7/20209; H05K 7/20327; H05K 7/20509; H05K 7/20745; H05K 7/20836
USPC ....................................................... 361/688
See application file for complete search history.

(56) References Cited

U.S. PATENT DOCUMENTS

| | | | | |
|---|---|---|---|---|
| 5,323,847 A * | 6/1994 | Koizumi | ............ | H05K 7/20645 165/104.33 |
| 6,234,240 B1 * | 5/2001 | Cheon | ...................... | F28D 15/00 165/185 |
| 6,807,056 B2 * | 10/2004 | Kondo | ....................... | G06F 1/20 165/104.33 |
| 7,012,807 B2 * | 3/2006 | Chu | ......................... | G06F 1/20 165/104.33 |
| 7,051,946 B2 * | 5/2006 | Bash | .................. | H05K 7/20836 165/80.3 |
| 7,310,737 B2 * | 12/2007 | Patel | ........................ | G06F 1/20 713/300 |
| 7,333,334 B2 * | 2/2008 | Yamatani | .................. | G06F 1/20 165/122 |
| 7,715,194 B2 * | 5/2010 | Brewer | ............. | H05K 7/20772 361/699 |
| 7,724,524 B1 * | 5/2010 | Campbell | .......... | H05K 7/20772 361/701 |

(Continued)

*Primary Examiner* — Anatoly Vortman
(74) *Attorney, Agent, or Firm* — Womble Bond Dickinson (US) LLP

(57) ABSTRACT

Disclosed are layouts, arrangements, and configurations of room airflow, server racks and cooling delivery subsystems that support data centers having system architectures with segregated compute and storage point of deliveries (PoDs). A cooling row is arranged in the rear side of racks housing a PoD to supply the PoD with the cooling delivery subsystem, which includes a recirculating loop supplying cooling fluid to the PoD and returning warm fluid to the cooling source. Modular cooling units of the cooling row includes cooling coils used to cool the airflow leaving the racks. The cooling capacity of the cooling liquid supplied to the cooling delivery subsystem for a PoD may be independently adjusted and controlled in a feedback loop based on the temperature of the air of the PoD after it has been cooled by the cooling coils, such as the outlet air temperature from the cooling row housing the PoD.

20 Claims, 10 Drawing Sheets

(56) References Cited

U.S. PATENT DOCUMENTS

| | | | | |
|---|---|---|---|---|
| 7,885,070 B2 * | 2/2011 | Campbell | .......... | H05K 7/20809 |
| | | | | 361/699 |
| 7,905,096 B1 * | 3/2011 | Campbell | .......... | H05K 7/20836 |
| | | | | 62/93 |
| 7,907,406 B1 * | 3/2011 | Campbell | ............ | H05K 7/2079 |
| | | | | 361/699 |
| 7,991,515 B2 * | 8/2011 | Lyon | ....................... | G06F 1/206 |
| | | | | 700/300 |
| 8,164,901 B2 * | 4/2012 | Neudorfer | .......... | H05K 7/20781 |
| | | | | 361/699 |
| 8,240,165 B2 * | 8/2012 | Novotny | ................. | F28D 15/00 |
| | | | | 62/259.2 |
| 8,619,425 B2 * | 12/2013 | Campbell | ............ | H05K 7/203 |
| | | | | 361/699 |
| 8,654,532 B2 * | 2/2014 | Chen | ................. | H05K 7/20781 |
| | | | | 361/701 |
| 8,804,334 B2 * | 8/2014 | Eckberg | ............ | H05K 7/20818 |
| | | | | 361/696 |
| 9,635,785 B1 * | 4/2017 | Heydari | ............ | H05K 7/20145 |
| 9,848,516 B2 * | 12/2017 | Heydari | ............ | H05K 7/20172 |
| 10,162,396 B2 * | 12/2018 | Cui | ........................ | G06F 1/206 |
| 10,225,957 B2 * | 3/2019 | Gao | ................... | H05K 7/20172 |
| 2013/0333865 A1 * | 12/2013 | Goth | ................... | H05K 7/20836 |
| | | | | 165/104.31 |
| 2014/0133098 A1 * | 5/2014 | Campbell | ............... | F28D 15/00 |
| | | | | 361/696 |
| 2018/0324976 A1 * | 11/2018 | Gao | ..................... | H05K 7/2079 |

* cited by examiner

DATA CENTER POINT OF DELIVERY LAYOUT AND CONFIGURATIONS

FIELD OF THE INVENTION

Embodiments of the present invention relate generally to data center configuration. More particularly, embodiments of the invention relate to the design and layout of thermal management and facility infrastructure to support deploying and operating electronic racks in data centers having different configurations of compute and storage point of deliveries (PoDs).

BACKGROUND

Computing clusters and data centers serve the computing, storage, and other information technology (IT) needs of today's information economy. With rapid technology development and ever more demanding performance requirements, new applications and workloads such as machine learning, video streaming, high performance computing, etc., new computing architectures such as a segregation of compute and storage resources or PoDs have gained prominence. Such computing architectures with segregated compute and storage PoDs have significant implications for the design and layout of data center facility and hardware infrastructure required to support them. For example, hardware configuration such as rack layout, system capacity, power rating, cooling method, networking configuration etc., may be different. As a result, traditional data center infrastructure may not be able to efficiently and cost effectively support the deployment and operation of the new computing architectures. The data center infrastructure also may not be easily adaptable to support computing architectures with different configurations of compute and storage segregations (e.g., different sizes and ratios of compute and storage PoDs).

Heat removal or thermal management is an important consideration in the design of data centers. As the number of high performance electronics components such as high performance processors and storage devices in compute and storage PoDs has steadily increased, the amount of heat generated and dissipated during the ordinary operations of the PoDs has also increased. The reliability of electronic components used within a data center decreases if the environment in which they operate is permitted to increase in temperature over time. Maintaining a proper thermal environment is critical for normal operations of these PoDs in data centers, as well as their performance and lifetime.

Thermal management of high performance PoDs in data centers of increasingly higher power density may use a combination of liquid and air cooling systems. However, it is difficult to flexibly adapt and scale the cooling infrastructure of the data center to meet the changing hardware configurations of the segregated compute and storage PoDs. The need to upgrade and renew IT equipment and deploy new computing architectures with segregated compute and storage PoDs at a much faster pace than the life cycle of the facilities housing the data centers makes it challenging to realize the full potential of the new computing architectures.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
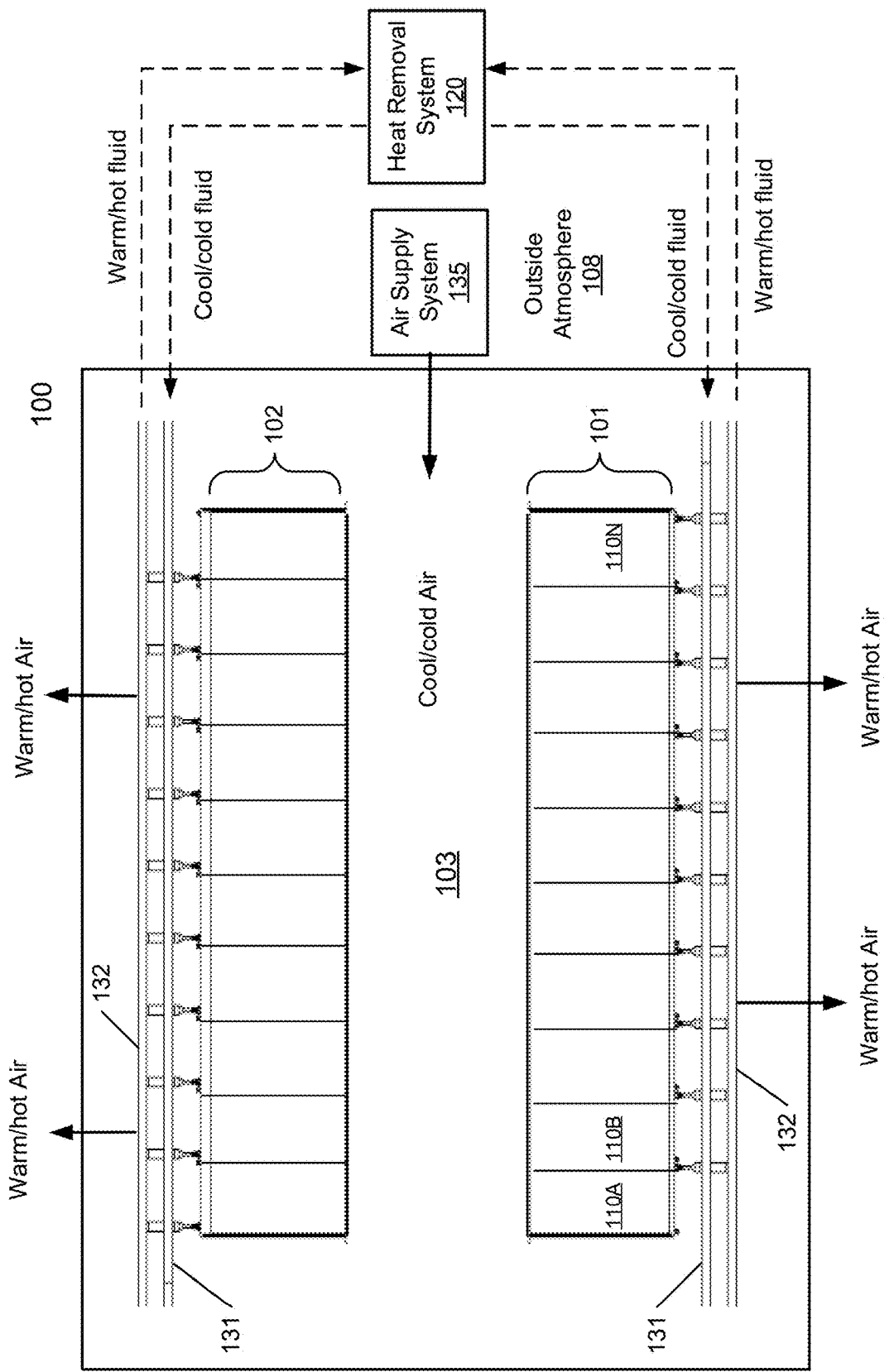
FIG. 1 is a block diagram illustrating an example of a data center facility.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed are layouts, arrangements, and configurations of room airflow, server racks and cooling delivery subsystems that support data centers having system architectures with segregated compute and storage point of deliveries (PoDs). The compute or storage PoDs, which may be referred to as IT PoDs, and the cooling delivery subsystems serving the IT PoDs are arranged such that the thermal management of the IT PoDs may be flexibly supported by the infrastructure of the data centers housing the IT PoDs. As the number, ratio, and configuration of compute and storage PoDs may be different to serve different IT applications, the compute and storage PoDs may have different power load, power density, etc., thus requiring different power and cooling delivery subsystems.

In one embodiment, the cooling delivery subsystem may include liquid cooling, or a combination of liquid cooling and air cooling, to flexibly support the thermal management function of the IT PoDs. The cooling capacity of the liquid supplied to the cooling delivery subsystem for a PoD may be independently adjusted and controlled in a feedback loop based on the temperature of the air of the PoD after it has been cooled by the cooling liquid, such as the inlet and/or outlet air temperature from the racks housing the PoD. Variations of cooling capacity may include variations in temperature or the volume of the cooling liquid. Advantageously, compute and storage PoDs may have different number of racks with different power load and still have independent temperature control, making it possible to manage IT PoDs with different power densities with a uniform thermal management solution.

In one embodiment, a cooling row is arranged in the rear side of each row of racks housing a PoD to supply the PoD with the cooling delivery subsystem. The cooling delivery subsystem may include the recirculating loop supplying cooling fluid to the PoD and returning warm fluid back to a cooling source. The design of the cooling row eliminates the traditional hot aisle and cold aisle layout or any containment structure of a data center by effectively treating the entire space of the data center as a cold aisle. The cooling row includes modular cooling units arranged in a row to supply the liquid cooling loop to cool the racks of the row. The main unit in each cooling unit may be a cooling coil that is used to cool the airflow leaving one or more racks. The cooling coil is supplied with the cooling liquid and functions as a heat exchanger to cool the temperature of the airflow heated by the electronic components housed in the rack.

In one embodiment, a liquid-to-liquid cooling coil (e.g., rack level liquid cooling unit, rack manifold, immersion cooling tank, etc.) may be connected to the cooling distribution subsystem in addition to, or in place of, the liquid-to-air cooling coil. Different types of IT racks (e.g., computing racks, storage racks, networking gear racks) may be arranged in any location of the PoD. Any of the IT space of the data center may be configured as a computing PoD, storage PoD, or a heterogeneous computing and storage PoD. The cooling row design may be flexibly adapted to satisfy the cooling requirement of the various layouts, arrangements, heat load, and configurations of the PoDs.

In one embodiment, the cooling rows arranged in the rear side of the rows of racks may be arranged in the same orientation throughout the data center room. The air from the racks after it has been cooled by the cooling coil of the cooling rows generally flows in the same direction. The cooling capacity of cooling liquid supplied to each row may be independently controlled based on the temperature of the air flow from the cooling row. The air temperature from the different cooling rows may thus be controlled to be relatively uniform regardless of the power loading of the racks associated with the cooling rows. Because of the uniformly directional air flow from the racks and the uniform temperature of the air flow, every location in the room may be considered identical in terms of thermal management.

In one embodiment, even when the cooling rows arranged in the rear side of the rows of racks face each other, so that the air from each cooling row of a pair flows toward each another, the air temperature from the two cooling rows may still be independently controlled to be relatively uniform. This layout is similar to the alternating hot aisle cold aisle arrangement of a traditional PoD, but because of the independent control of air temperature of the cooling rows, the layout does not experience the temperature gradient between the hot aisle and cold aisle of the traditional PoD.

In one embodiment, the cooling rows and the associated racks may be divided into an upper portion and a lower portion. The upper portions of all the rows may be in one orientation and the lower portions of all the rows may be in the opposite orientation. The air flows from the two portions of the rows thus may flow in the opposite directions. This arrangement may also lend itself to be thermally managed by the independent temperature control of the rows to remove any temperature gradient between locations in the room, or to keep the room temperature uniform.

In one embodiment, one of the key components of the cooling rows include modular cooling units with integrated fluid distribution piping that may be interconnected to form the cooling distribution subsystem that supplies cooling liquid to the cooling coils to carry away heat generated by electronic components housed within the racks associated to the cooling rows. The assembly of modular cooling units may be connected to the cooling liquid supply and return loops of the data center facility to distribute cooling liquid to the electronic components of the racks and to return heated liquid for heat removal. The cooling capacity of the cooling rows may be independently controlled. The network of fluid distribution piping integrated into the cooling units enables the configuration of the cooling distribution subsystem to be independent of the fixed infrastructure of the facility, affording ease of scalability, serviceability, maintenance, while increasing efficiency, resiliency, availability, and reliability of the liquid cooling system.

FIG. 1 is a block diagram illustrating an example of a data center or data center unit. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers, computing nodes, or storage nodes that provide data services to a variety of clients over a network (e.g., the Internet). In this embodiment, each row includes an array of electronic racks such as electronic racks 110A-110N, arranged in row 101 and row 102. However, more or fewer rows of electronic racks may be implemented. Each row may be part of a compute PoD, storage PoD, or a heterogeneous compute and storage PoD. Typically, rows 101-102 are aligned in parallel with frontends facing towards each other (or facing away each other; for example, if multiple of the system shown in FIG. 1 are deployed, two of the racks maybe understood as facing away from each other depending how the racks are grouped) and backends facing away from each other, forming aisle 103 in between to allow an administrative person walking and performing servicing therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server blades or server slots. Each server blade represents a computing node having one or more processors, a memory, and/or a persistent storage device (e.g., hard disk). At least one of the processors may be attached to a liquid cold plate (also referred to as a cold plate assembly) to receive cooling liquid. In addition, one or more optional cooling fans are associated with the server blades to provide air cooling to the computing nodes contained therein. Note that a heat removal system 120 may be coupled to multiple data center systems such as data center system 100.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, waste heat recovery designs, or a chiller system with active refrigeration cycle. Heat removal system 120 may include or be coupled to a cooling liquid source that provides cooling liquid.

In one embodiment, each server blade is coupled to a heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is used to receive heat removal liquid via a second liquid intake connector from the heat removal liquid manifold mounted on a backend of the electronic rack. The first liquid outlet connector is used to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold is disposed on the backend of each electronic rack and is coupled to liquid supply line 131 to receive heat removal liquid (also referred to as cooling liquid) from heat removal system 120. The heat removal liquid is distributed through a liquid distribution loop attached to a cold plate assembly on which a processor is mounted to remove heat from the processor. A cold plate is configured similar to a heat sink with a liquid distribution tube attached or embedded therein. The resulting warmer or hotter liquid carrying the heat exchanged from the processors is transmitted via liquid return line 132 back to heat removal system 120.

Liquid supply/return lines 131-132 are referred to as data center or room liquid supply/return lines (e.g., global liquid supply/return lines), which supply heat removal liquid to all of the electronic racks of rows 101-102. In one embodiment, liquid supply/return lines 131-132 may be integrated within modular cooling units that connect to the electronic racks 110A-110N as will be discussed. Electronic racks 110A-110N may be assembled to form rows 101 or 102 by interconnecting the liquid supply/return lines 131-132 of adjacent modular cooling units to form cooling rows and connecting the liquid supply/return lines 131-132 of modular cooling units of the cooling rows to the cooling liquid manifold of the electronic racks 110A-110N to complete the cooling liquid supply and return loop with the supply/return lines of the data center facility. The liquid supply line 131 and liquid return line 132 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an optional airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates an airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the other electronics or processing devices is removed by airflow cooling.

In one embodiment, the electronic racks 102 may have its own internal airflow delivery system, such as fans, to cause the airflow to travel through the air space of the electronic racks 102 to exchange heat generated by the compute or storage PoDs with cooling coils of the modular cooling units of the cooling rows. The cooling coils are supplied with the cooling liquid of the liquid supply/return lines 131-132 to cool the airflow. The cooled airflow of the electronic racks 102 after the heat exchange with the cooling coil may flow out of the cooling rows and used in a feedback loop to adjust and control the cooling capacity of the cooling liquid supplied to the cooling rows of the electronic racks 102.

Figure 2:
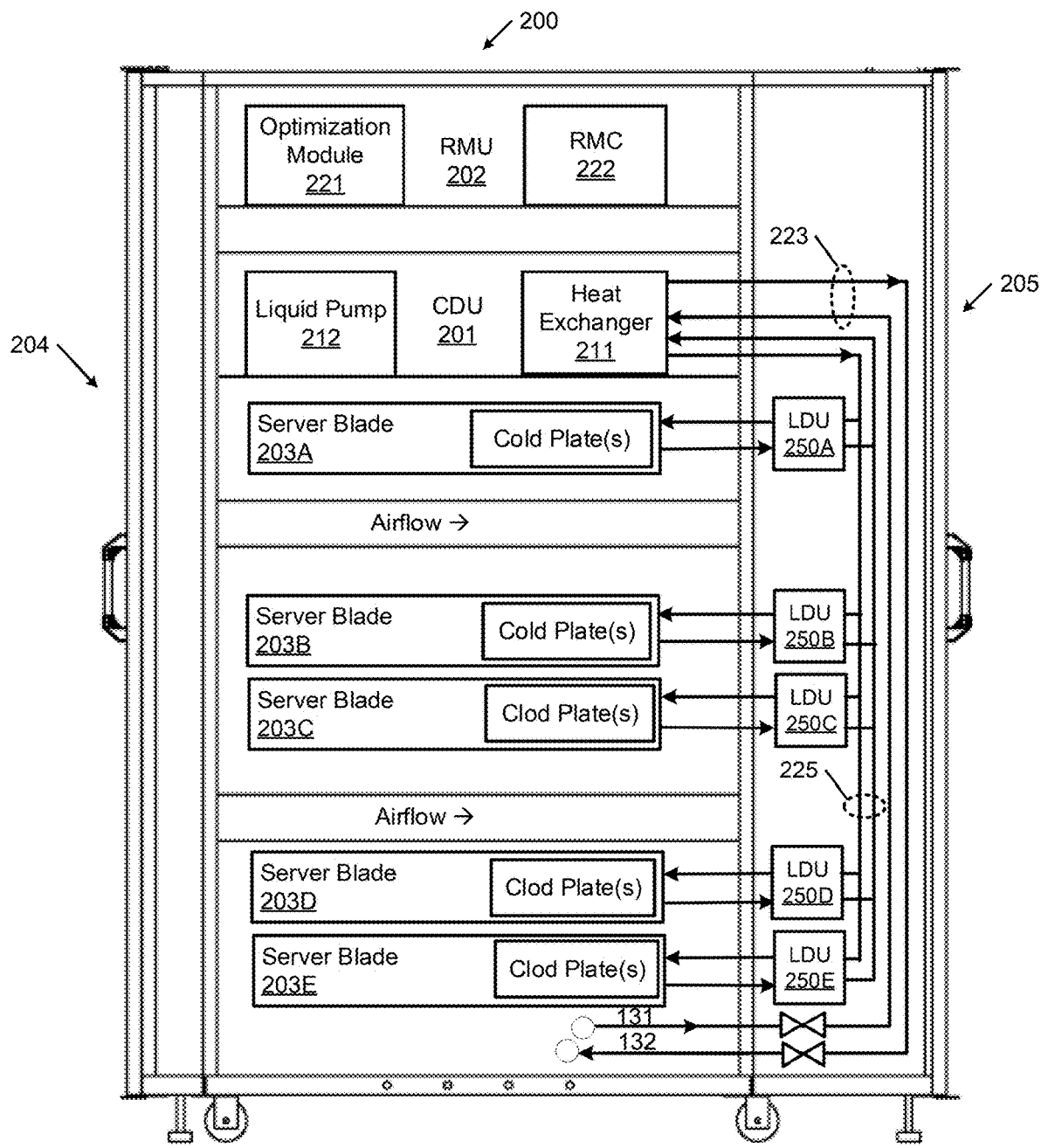
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, optional rack management unit (RMU) 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend. Electronic rack 200 may be part of a computing PoD, storage PoD, or a heterogeneous computing and storage PoD.

In addition, for at least some of the server blades 203, an optional fan module (not shown) is associated with the server blade. Each of the fan modules includes one or more cooling fans. The fan modules may be mounted on the backends of server blades 203 or on the electronic rack to generate airflows flowing from frontend 204, traveling through the air space of the sever blades 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger or cooling coil. Heat exchanger 211 includes a first loop 223 with inlet and outlet ports having a first pair of liquid connectors coupled to liquid supply/return lines 131-132 that are integrated to the electronic rack 200 to form a primary loop. The integrated liquid supply/return lines 131-132 may be disposed on the bottom of backend 205 of electronic rack 200. The liquid supply/return lines 131-132, also referred to as room liquid supply/return lines, are coupled to heat removal system 120 through supply/return lines 131-132 of a modular cooling unit of a cooling row as will be explained. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs that are commercially available or may be customized. In one embodiment, heat exchanger 211 of CDU 201 may be an air-to-liquid heat exchanger or a cooling coil. The details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. In one embodiment, server blades 203 may be part of a compute PoD and may include a host server (referred to as a host node) coupled to one or more compute servers (also referred to as computing nodes, such as CPU server and GPU server, and servers with ASIC and FPGA units). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, video streaming, deep learning algorithms or modeling, etc., as a part of a software-as-a-service or SaaS platform). In response to the request, the host server distributes the tasks to one or more of the computing nodes or compute servers (e.g., having one or more GPUs or ASICs) managed by the host server. The compute servers perform the actual tasks, which may generate heat during the operations. In one embodiment, when the IT components are part of a storage PoD that includes an array of storage devices, the IT components may provide storage service such as cloud-based storage services for the clients or the compute PoD.

Electronic rack 200 further includes optional RMU 202 and power supply unit (PSU) (not shown in the figure) configured to provide and manage power supplied to servers 203, and CDU 201. RMU 202 may be coupled to a battery backup unit (also not shown) to provide backup energy to the electronic rack 200 and servers 203. The PSU may include the necessary circuitry (e.g., an alternating current (AC) to direct current (DC) or DC to DC power converter, battery, transformer, or regulator, etc.,) to regulate power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, server blades 203, CDU 201, and fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules and liquid pump 212, which may be proportional to their respective speeds. These operating data are referred to as real-time operating data. Note that the monitor may be implemented as a separate module within RMU 202. Based on the operating data, optimization module 221 performs an optimization using a predetermined optimization function or optimization model to derive a set of optimal fan speeds for fan modules and an optimal pump speed for liquid pump 212. In one embodiment, RMU 202 may adjust and control the cooling capacity of the cooling liquid supplied to the cooling unit connected to the rack 200 based on the temperature of the airflow after going through heat exchange via the heat exchanger 211 or the cooling coil of the cooling unit.

Figure 3:
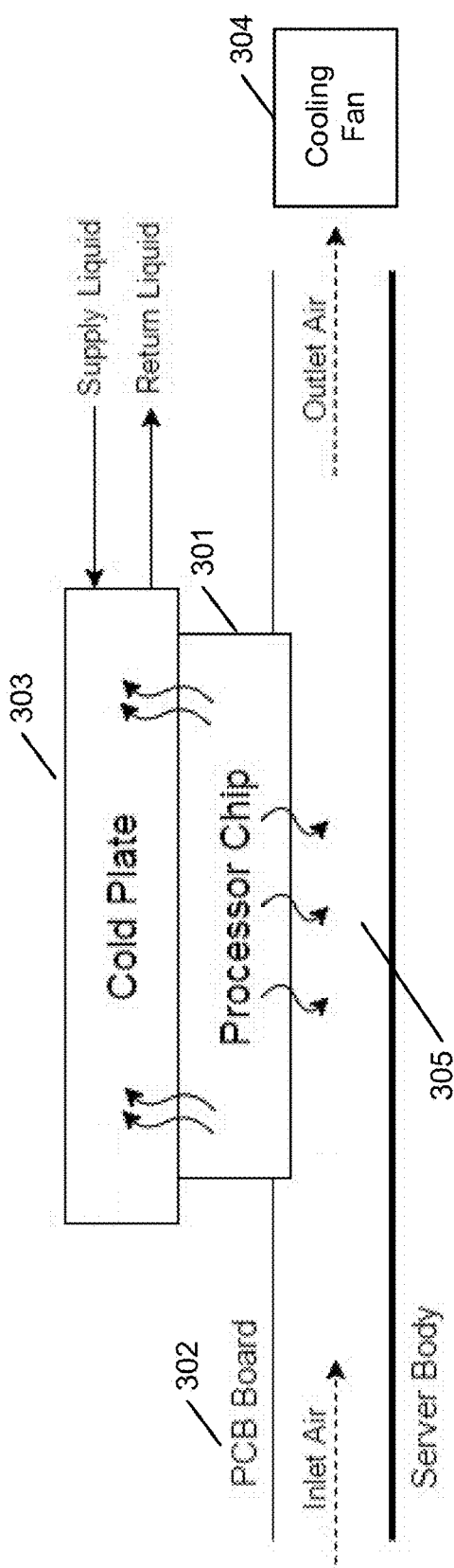
FIG. 3 is a block diagram illustrating an example of a cold plate configuration according to one embodiment.

FIG. 3 is a block diagram illustrating a processor cold plate configuration according to one embodiment. The processor/cold plate structure 301/303 can represent any of the processors/cold plate structures of server blades 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to liquid supply line and liquid return line. A portion of the heat generated by processor 301 is removed by the cooling liquid via cold plate 303. The remaining portion of the heat enters into open air space 305, which may be removed by an airflow generated by cooling fan 304.

Referring back to FIG. 2, according to one embodiment, electronic rack 200 further includes one or more liquid distribution units (LDUs), such as LDUs 250A-250E (collectively referred to as LDUs 250), positioned between server blades 203 and rack manifolds 225. Each LDU operates as a local liquid distribution manifold and also a cooling device to a server blade 203. In FIG. 2, LDUs 250 are shown outside of the server blades 203, but they can be designed in the server blades 203. In this example, there is an LDU corresponding to one of the server blades 203. However, in other embodiments, although not shown, an LDU can be associated with multiple server blades 203.

Similar to a CDU, a primary loop is formed between an LDU and rack manifold 225, while a secondary loop is formed between the LDU and a server blade. As a result, the liquid distribution loop is significantly shortened compared to a conventional system. In a conventional system, the cooling liquid received either from supply line 132 or from CDU 201 has to travel through each of the cold plates in server blades 203. As a result, the liquid distribution loop is much longer and the power to pump the liquid requires much higher. With LDUs 250, each secondary loop coupled to the cold plates of a server blade is a local individual loop. In one embodiment, the cooling liquid distributed to the server blade is a two-phase cooling liquid that transitions between a liquid form and a vapor form based on the temperature. In such a configuration, a liquid pump for the secondary loop may not be needed.

In one embodiment, a cooling row is connected to each row of racks, such as racks 200 of FIG. 2, housing a PoD to supply the PoD with the cooling distribution subsystem. The cooling distribution subsystem may include the recirculating loop supplying cooling fluid to the PoD and returning warm fluid back to a cooling source of the data center infrastructure. Different types of IT racks (e.g., computing racks, storage racks, networking gear racks) may be arranged in any location of the PoD. Any space of the data center may be configured as a computing PoD, storage PoD, or a heterogeneous computing and storage PoD. The cooling row may be flexibly configured to satisfy the cooling requirement of the various layouts, arrangements, heat load, and configurations of the PoDs.

Figure 4:
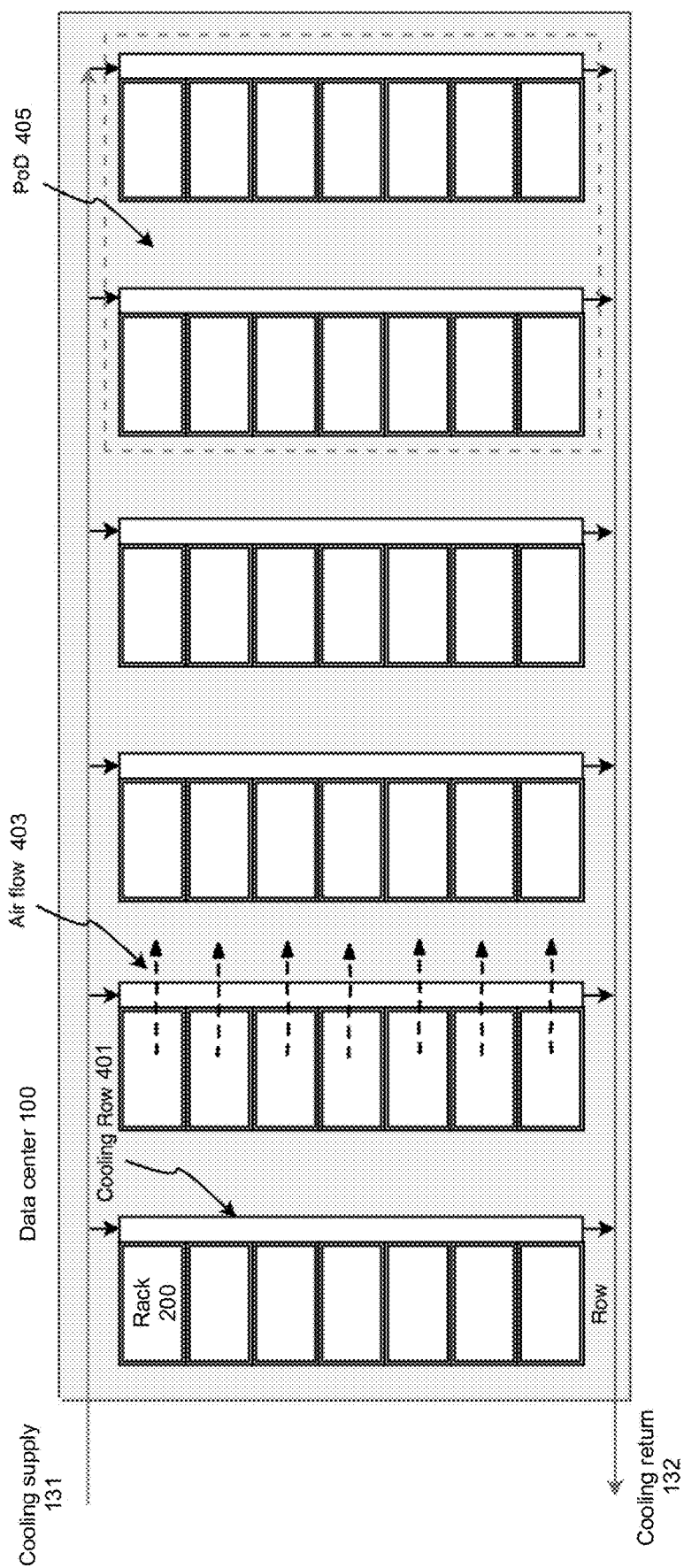
FIG. 4 is a top level layout view of the cooling rows and the associated rows of racks showing the cooling row are arranged in the same orientation throughout the data center according to one embodiment.

FIG. 4 is a top level layout view of the cooling rows 401 and the associated rows of racks 200 showing the cooling rows 401 are arranged in the same orientation throughout the data center 100 according to one embodiment. Cooling fans in racks 200 may draw air heated by the electronic components through the air space of racks 200 to be cooled by the cooling coils (not shown) of cooling rows 401. The cooling coils of cooling rows 401 are supplied with the cooling liquid from cooling supply/cooling return lines 131-132. The air from racks 200 after it has been cooled by the cooling coil of cooling row 401 flows out of cooling rows 401 in the same direction for all rack 200 of cooling row 401, as indicated by outlet airflow 403, and also for all racks 200 of the various cooling rows 401. The outlet airflow 403 from one cooling row 401 thus may be in the same direction as the inlet airflow into the adjacent cooling row 401. For example, the air outlet from one row of racks 200 and associated cooling row 401 may face the air inlet of the adjacent row of racks 200 and associated cooling row 401.

In one embodiment, the temperature of outlet airflow 403 from a cooling row 401 may be measured to control the cooling capacity, such as the temperature or the volume, of cooling liquid supplied to the cooling row 401. Racks 200 may house different arrangement of compute or storage PoDs irrespective of the power load requirement of the PoDs. The number, ratio, and configuration of compute and storage PoDs may be varied to serve different IT applications. One PoD 405 that encompasses two rows of racks 200 is shown. Because racks 200 housing the PoDs may have different power load and power densities, they may dissipate different amount of heat, and thus may require different cooling delivery subsystem. In one embodiment, the cooling delivery subsystem, in addition to or in place of providing liquid cooling of the airflow, may include liquid-to-liquid cooling coil, the cold plate 303 of FIG. 3, or other liquid-to-liquid cooling apparatus (e.g., rack level liquid cooling unit, rack manifold, immersion cooling tank, etc.) to flexibly support the thermal management function of the PoDs.

In one embodiment, the cooling capacities of different cooling rows 401 may be independently controlled to account for the different power loading of the PoDs based on the temperature of outlet airflow 403 from the different cooling rows 401. The air temperature from the different cooling rows 401 may thus be controlled to be relatively uniform regardless of the power loading of the racks 200 connected to the cooling rows 401. Because of the uniformly directional air flow from racks 200 and the uniform temperature of the airflow, every location in data center 100 may be considered identical in terms of thermal management. This means any variations in IT rack can be deployed in any IT space in the data center 100 without causing any thermal impact, or causing only negligible thermal impact, on any other space. Thus, all of data center 100 may be considered as a cold aisle using the cooling row 401, which also enables the configuration of the cooling distribution subsystem to be independent of the fixed cooling infrastructure of data center 100.

Figure 5:
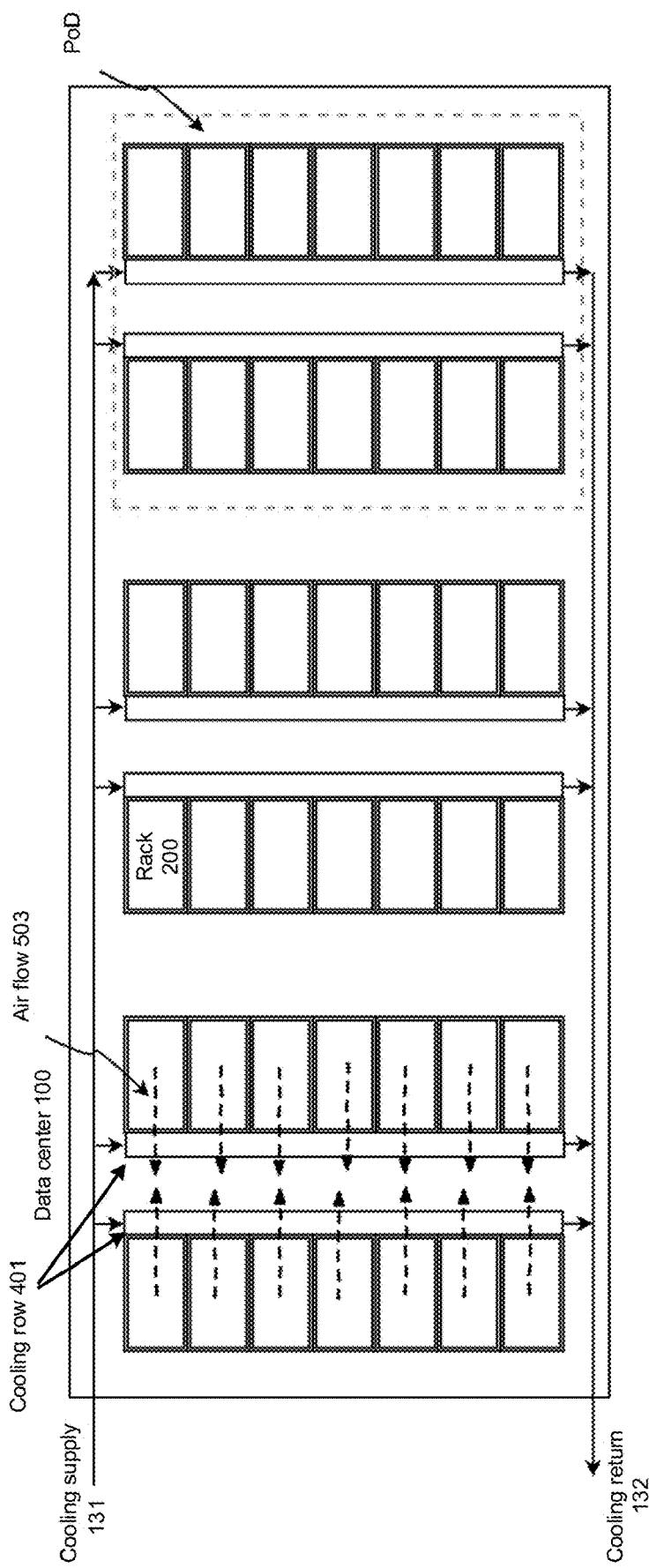
FIG. 5 is a top level layout view of the cooling rows and the associated racks in the data center arranged such that each pair of cooling rows face one another according to one embodiment.

FIG. 5 is a top level layout view of the cooling rows 401 and the associated racks 200 in the data center 100 arranged such that each pair of cooling rows 401 face one another according to one embodiment. This embodiment may be considered to merge the design concept proposed in the current disclosure with a traditional hot aisle-cold aisle data center. For example, when retrofitting a data center to support the design of the current disclosure, instead of doing a complete rebuild, some of the existing facility such as power facility or networking facility can remain intact and the current thermal design configuration can be implemented as well, to save cost. The outlet airflow 503 from each cooling row 401 of the pair flows toward each another. In one embodiment, the cooling capacities of the pair of cooling rows 401 may be jointly controlled if the pair of racks 200 cooled by the pair of cooling rows 401 have similar power loading based on outlet airflow 503 from either cooling row 401.

In one embodiment, the cooling capacities of the pair of cooling rows 401 may be independently controlled to account for the different power loading of the pair of racks 200 cooled by the pair of cooling rows 401 based on the temperature of outlet airflow 503 from the respective cooling rows 401, even if the outlet airflows 503 from the pair may mix. Independent control of the pair of cooling rows 401 allows the temperature of outlet airflow 503 from the two cooling rows 401 to be relatively uniform. This layout of the racks 200 is similar to the alternating hot aisle cold aisle arrangement of a traditional PoD, but because of the independent control of the cooling capacities of cooling rows 401 connected to racks 200, the layout does not experience the temperature gradient between the hot aisle and cold aisle of the traditional PoD.

Figure 6:
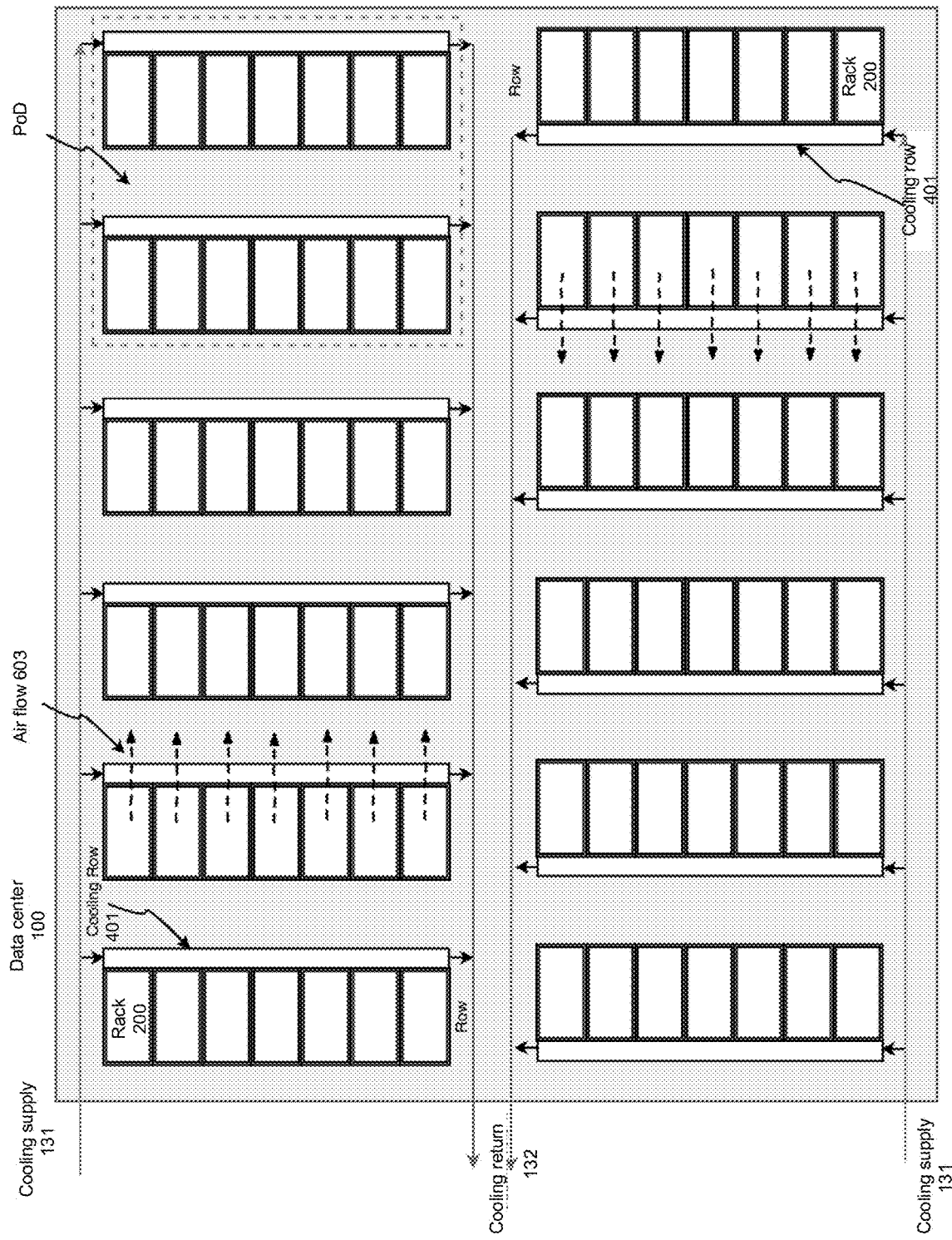
FIG. 6 is a top level layout view of the cooling rows and the associated racks in the data center arranged such that an upper portion and a lower portion of the cooling rows face in the opposite directions according to one embodiment.

FIG. 6 is a top level layout view of the cooling rows 401 and the associated racks 200 in the data center 100 arranged such that an upper portion and a lower portion of the cooling rows face in the opposite directions according to one embodiment. The upper portions of all cooling rows 401 may be in one orientation and the lower portions of all cooling rows 401 may be in the opposite orientation. The outlet airflows 603 from the two portions of cooling rows 401 thus may flow in the opposite directions. This layout enables different data center room airflow dynamics design which may be used for different use cases, such as PoD partitioning. The cooling capacities of cooling rows 401 may also be independently controlled to remove any temperature gradient between locations in data center 100, or to keep the room temperature uniform. In one embodiment, an optimization and parameter analysis may be used to optimally control the airflow 603. For example, the RMU 202 of FIG. 2 may monitor temperature and volume of airflows through racks 200. Based on the data, optimization module 221 of RMU 202 may perform an optimization using a predetermined optimization model to derive a set of optimal fan speeds for fan modules of racks 200 to control airflow 603.

Figure 7:
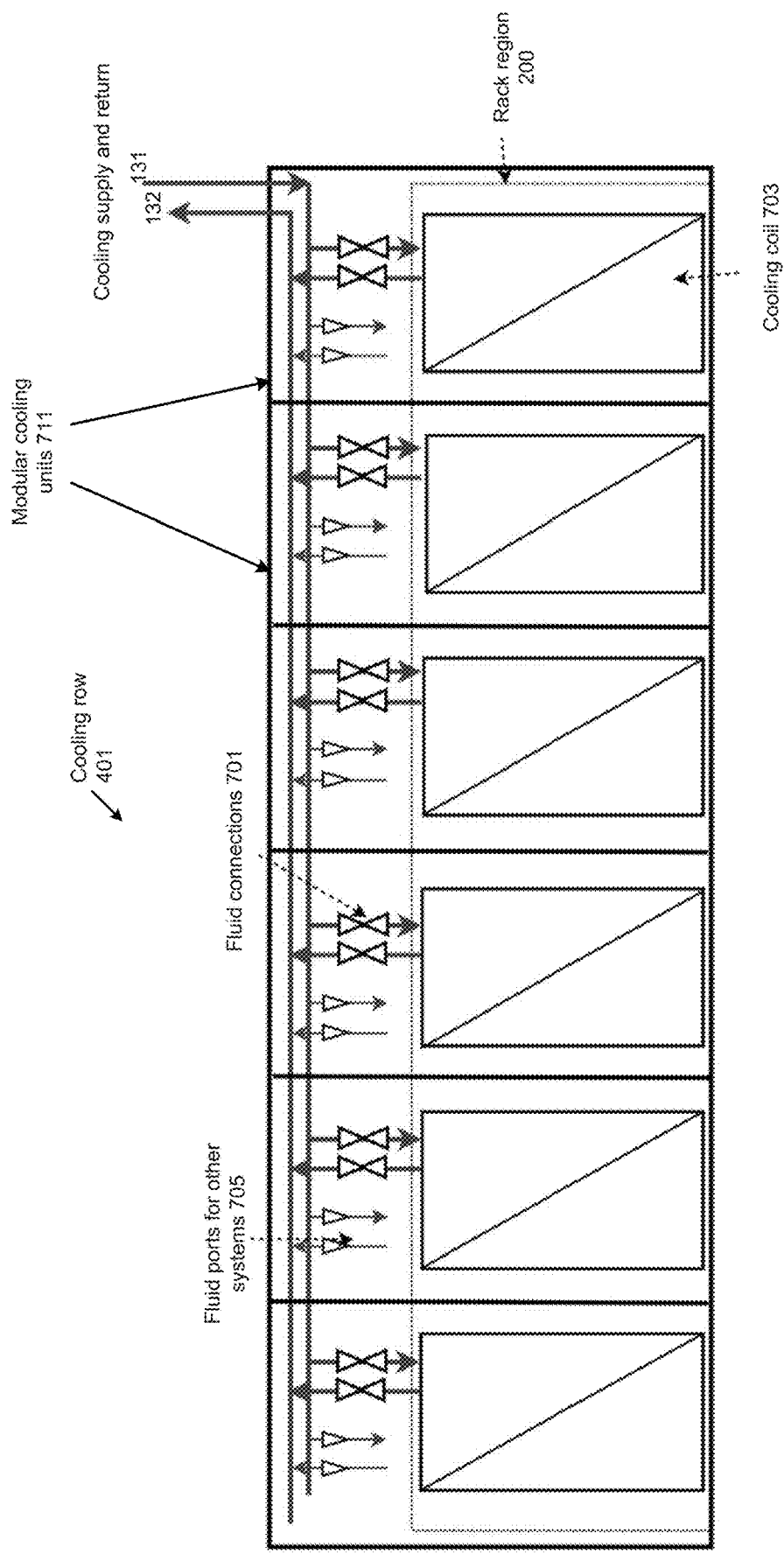
FIG. 7 is a side or rear view of the cooling row showing the fluid connections for the liquid supply and return loops to each cooling coil that is used to individually cool each rack according to one embodiment.

FIG. 7 is a side or rear view of the cooling row 401 showing the fluid connections 701 for the liquid supply and return loops 131-132 to each cooling coil 703 that is used to individually cool each rack 200 according to one embodiment. The cooling row may include modular cooling units 711 arranged in a row to supply the liquid cooling loop to cool racks 200 of the row. The main unit in each cooling unit may be a cooling coil 703 that is used to cool the airflow blown through one or more racks 200. The cooling coil is supplied with the cooling liquid from cooling supply line 131 through a cooling distribution subsystem, and functions as a liquid-to-air heat exchanger to cool the temperature of the airflow carrying the heat from the electronic components housed in the racks 200.

In one embodiment, liquid-to-liquid cooling apparatus (e.g., rack level liquid cooling unit, rack manifold, immersion cooling tank, etc.) or cold plate 303 of FIG. 3 may be connected to the cooling distribution subsystem of cooling row 401 in addition to, or in place of, the liquid-to-air cooling coil 703. In one embodiment, if the liquid-to-liquid cooling apparatus has sufficient cooling capacity to cool racks 200, liquid-to-air cooling of the airflow using cooling coil 703 may not be needed. In that case, cooling coil 703 may be easily removed.

Different types of IT racks (e.g., computing racks, storage racks, networking gear racks) may be arranged in any location of racks 200. Any part of racks 200 may be configured or partitioned as a computing PoD, storage PoD, or heterogeneous computing and storage PoDs. The cooling distribution subsystem of cooling rows 401 including liquid-to-air cooling coils 703 and liquid-to-liquid apparatus has cooling capacity that may be flexibly adapted to support the cooling requirement of the various layouts, arrangements, heat load, and configurations of the PoDs housed in racks 200.

In one embodiment, the modular cooling units 711 of cooling rows 401 have integrated fluid distribution piping that may be interconnected to form the cooling distribution subsystem for distributing cooling liquid from cooling supply line 131 to cooling coils 703 and liquid-to-liquid apparatus of racks 200 and returning heated liquid through return line 132. For example, fluid connections 701 and fluid ports 705 may supply the cooling liquid to and return heated liquid from cooling coils 703 and/or liquid-to-liquid cooling apparatus such as rack level liquid cooling unit, rack manifold, immersion cooling tank, cold plate, etc. In one embodiment, fluid ports 705 may be used as redundant ports for the main ports (e.g., fluid connections 701) of cooling coil 703. In one embodiment, cooling coils 703 may be positioned higher than racks 200 for more efficient heat exchange with the warm rising air from racks 200. The modular cooling units 711 of cooling rows 401 may be serviced from the rear side of cooling rows 401 for easy access. In one embodiment, cooling rows 401 may include an internal structure used to prevent fluid spill in the event of any leakage of the cooling distribution subsystem.

The cooling capacity of cooling rows 401 may be independently controlled by controlling the temperature and/or volume of cooling liquid from cooling supply line 131. In one embodiment, the cooling capacity of the modular cooling units 711 of cooling rows 401 may be independently controlled through pumps (not shown) that control the volume of cooling liquid supplied to racks 200. FIG. 7 shows that cooling coil 703 of each modular cooling unit 711 of cooling rows 401 may separately provide the cooling needs for each rack 200. The integrated fluid distribution piping and the modular construction of cooling rows 401 enables the configuration of the cooling distribution subsystem for racks 200 to be independent of the fixed infrastructure of the facility, increasing scalability, efficiency, resiliency, availability, and reliability of the liquid cooling system.

Figure 8:
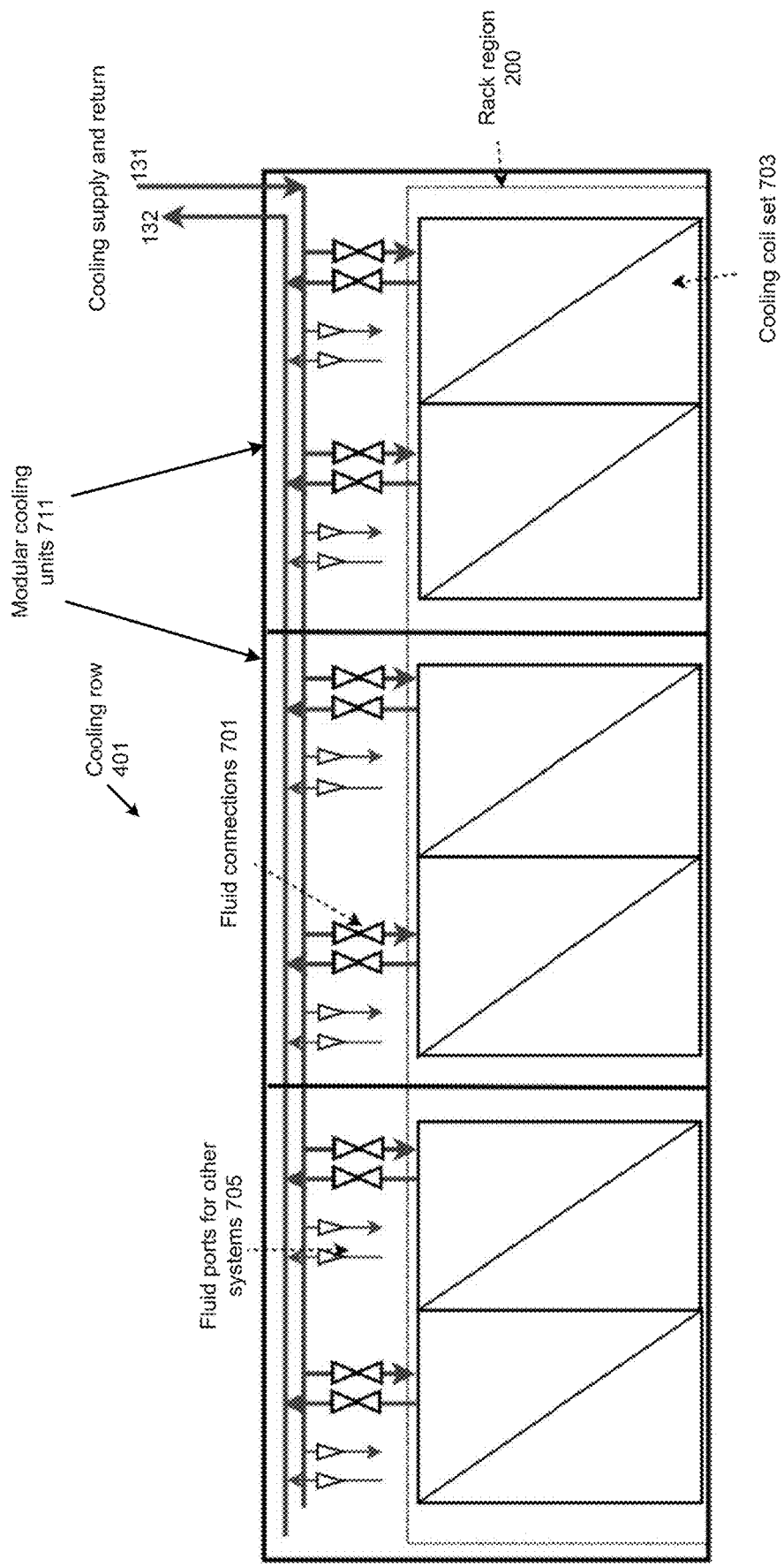
FIG. 8 is a side or rear view of the cooling row showing the fluid connections for the liquid supply and return loops to each cooling coil set that is shared among two adjacent racks according to one embodiment.

FIG. 8 is a side or rear view of the cooling row 401 showing the fluid connections for the liquid supply and return loops 131-132 to each cooling coil set 703 that is shared among two adjacent racks 200 according to one embodiment. The two cooling coils of the cooling coil set 703 can also be used as a redundant backup for each other.

Cooling coil set 703 may be supplied with the cooling liquid from the cooling distribution subsystem of a pair of adjacent modular cooling units 711 through fluid connections 701. Cooling coil set 703 may function as a liquid-to-air heat exchanger to cool the temperature of the airflow carrying the heat from the electronic components housed in the pair of racks 200. In one embodiment, more than two cooling coils can be arranged in one shared region.

Figure 9:
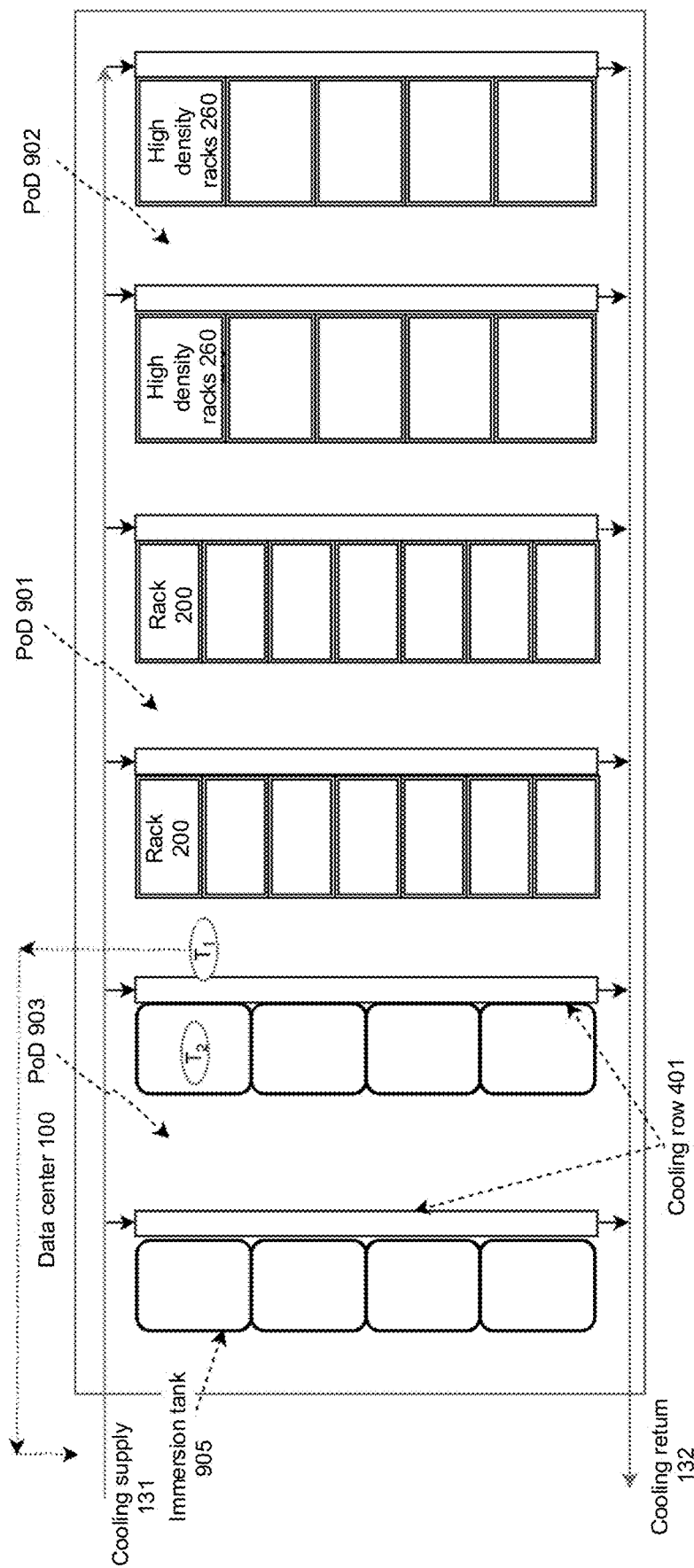
FIG. 9 is a top level layout view of the cooling rows and the associated racks configured such that the temperature of the air flow from the cooling row is used to independently control the cooling capacity of the cooling liquid supplied to the cooling row according to one embodiment.

FIG. 9 is a top level layout view of the cooling rows 401 and the associated racks 200 configured such that the temperature $T_1$ of the air flow from the cooling row 401 is used to independently control the cooling capacity of the cooling liquid supplied to the cooling row 401 according to one embodiment. Racks 200 may house various layouts, arrangements, and configurations of computing PoDs, storage PoDs, or heterogeneous computing and storage PoDs to serve different IT applications. The PoDs may have different power loadings, power densities, etc., thus requiring different cooling delivery subsystems, such as liquid-to-air cooling, liquid-to-liquid cooling, or a combination thereof for heat exchange.

For example, a first PoD 901 may include two regular racks 200, such as racks for homogeneous computing. A second PoD 902 may include two high density racks 260 that have higher power density for running machine learning or high performance computing (HPC) workload and thus more stringent cooling requirement than those of regular racks 200. First PoD 901 and second PoD 902 may use liquid-to-air cooling coils (not shown). A third PoD 903 may use liquid-to-liquid cooling apparatus such as immersion cooling tanks 905 in addition to liquid-to-air cooling coils. The fluid running in the cooling coils may be identical for the entire room. If certain IT or rack requires different types of operating fluid, such as immersion cooling fluid, additional units may be added to the cooling coils, racks 200 or immersion tanks 905.

In one embodiment, the cooling capacity of the liquid supplied to the cooling delivery subsystem for a PoD may be independently adjusted and controlled in a feedback loop based on the temperature $T_1$ of the outlet airflow of cooling rows 401 connected to the racks of the PoD after the airflow has been cooled by the cooling coils of cooling rows 401. For example, the facility or the RMU 202 of the racks may monitor temperature $T_1$ of cooling rows 401 to adjust the temperature or the volume of the cooling liquid supplied to cooling rows 401 from cooling supply line 131. In one embodiment, the volume of the cooling liquid supplied to cooling rows 401 may be adjusted via valves or pumps (not shown) of cooling row 401. In one embodiment, the cooling capacity of each PoD or the cooling capacity of each cooling row of a PoD may be controlled independently by monitoring temperature $T_1$ from the PoD or the cooling row of the PoD. Temperature $T_1$ may thus be considered as the cold aisle temperature control for the PoD, enabling the PoD to independently and dynamically adjust the cooling capacity to the PoD independent of the fixed infrastructure of the facility. The control of the cooling capacity may be executed at different levels, such as at a cooling coil level, cooling row 401 level or at a PoD level, such as PoDs 405, 901, 902, or 903.

In one embodiment, temperature $T_2$ may be the air temperature within a rack. The airflow in the racks may be controlled and adjusted in a feedback loop based on temperature $T_2$ of the rack. For example, the RMU 202 of FIG. 2 may monitor temperature $T_2$ and volume of airflows through the rack. Based on the data, optimization module 221 of RMU 202 may perform an optimization using a predetermined optimization model to derive a set of optimal fan speeds for fan modules of the rack to control the airflow. Again, the PoD may independently and dynamically adjust the airflow of the PoD independent of the fixed infrastructure of the facility.

In one embodiment, if the cooling delivery subsystems uses liquid-to-liquid cooling, the temperature of the warm liquid returned by the liquid-to-liquid cooling apparatus of a PoD after the heat exchange may be measured. The facility or the RMU 202 of the racks may monitor liquid temperature of cooling rows 401 to adjust the temperature or the volume of the cooling liquid supplied to cooling rows 401 from cooling supply line 131. In one embodiment, different cooling supply and return lines 131-132 may supply cooling liquid to and return warm liquid from different cooling rows 401 or PoDs.

Figure 10:
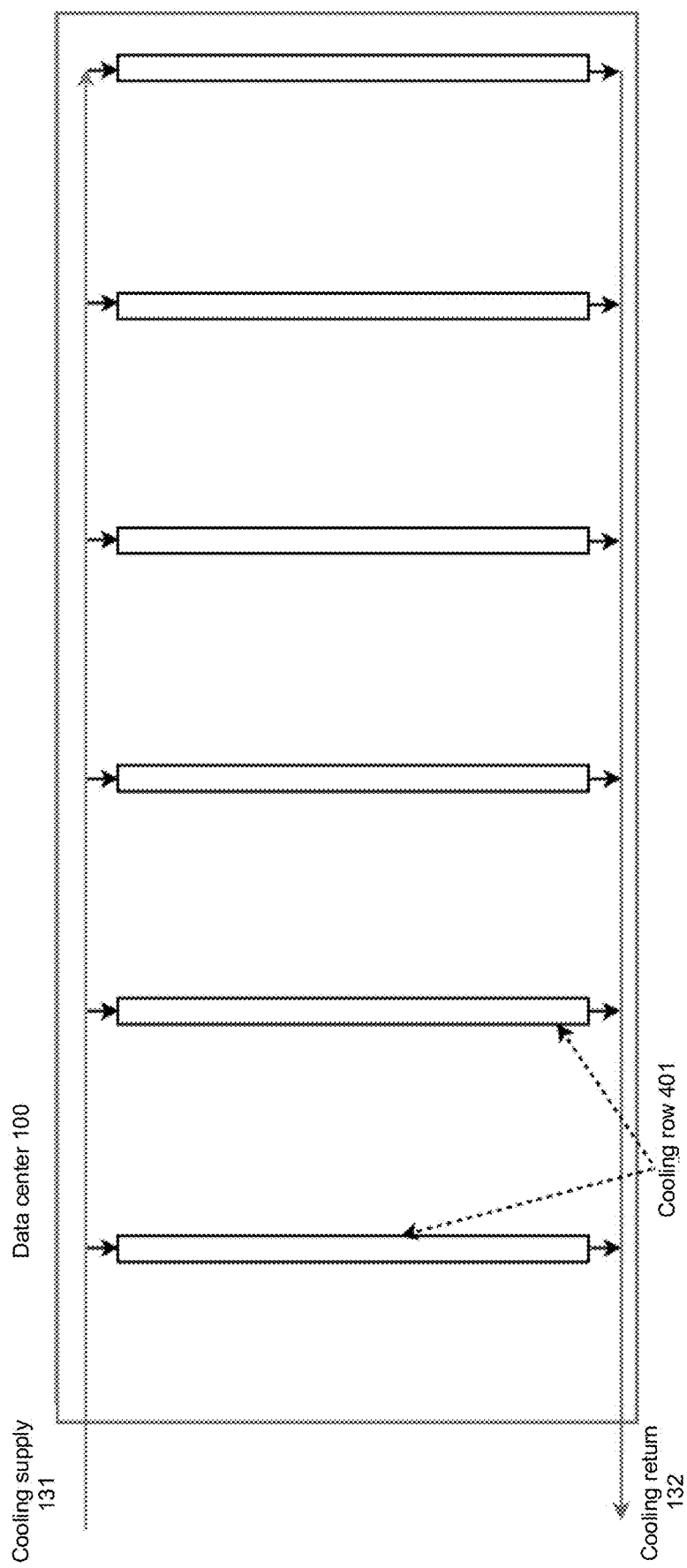
FIG. 10 is a top level view of the cooling rows connected to the facility infrastructure to form a cooling liquid supply loop and a warm liquid return loop of a liquid cooling system before racks are attached according to one embodiment.

FIG. 10 is a top level view of the cooling rows 401 connected to the facility infrastructure to form a cooling liquid supply loop 131 and a warm liquid return loop 132 of a liquid cooling system before racks are attached according to one embodiment. Cooling rows 401 may be flexibly arranged in various layouts as shown in FIGS. 4, 5, 6 to accommodate different layouts, arrangements, and configurations of computing PoDs, storage PoDs, or heterogeneous computing and storage PoDs. FIG. 10 shows a data center room setup before deploying any IT equipment. The individual equipment within the cooling row 401 is not shown in this figure. Advantageously, the cooling distribution subsystem and modular construction of cooling rows 401 may flexibly support fast-changing IT requirements including variations in power densities, form factors, cooling methods, power delivery mechanisms, rack layout, networking configuration, PoD configurations, etc., without rendering obsolete the data center infrastructure.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A liquid cooling apparatus of a data center having a plurality of rows of interconnected modular cooling units, each of the modular cooling units comprising:
   a fluid distribution subsystem configured to supply a cooling liquid received from a cooling liquid source to a liquid-to-air heat exchanger and to return warm liquid from the liquid-to-air heat exchanger back to the cooling liquid source; and
   a cooling coil of the liquid-to-air heat exchanger configured to receive the cooling liquid from the fluid distribution subsystem to remove heat from a thermal load carried by an airflow blown through the cooling coil, wherein a cooling capacity of the cooling liquid supplied to each of the modular cooling units is controlled based on a temperature of the airflow after the heat from the thermal load is removed by the liquid-to-air heat exchanger so that the temperature of the airflow is uniform for the plurality of rows of the interconnected modular cooling units of the data center independently of a relative orientation of the plurality of rows of the interconnected modular cooling units and the thermal load associated with the plurality of rows of the interconnected modular cooling units.

2. The liquid cooling apparatus of claim 1, wherein the cooling capacity of the cooling liquid supplied to each of the plurality of rows of the interconnected modular cooling units is controlled independently.

3. The liquid cooling apparatus of claim 1, wherein the thermal load comprises a point of delivery (PoD) of the data center, wherein the PoD comprises one of a compute PoD, a storage PoD, or a combination of the compute PoD and the storage PoD.

4. The liquid cooling apparatus of claim 1, wherein the cooling coil is positioned higher than a source of the thermal load.

5. The liquid cooling apparatus of claim 1, wherein to control the cooling capacity of the cooling liquid to the modular cooling unit based on the temperature of the airflow after the heat from the thermal load is removed by the liquid-to-air heat exchanger, a volume or a temperature of the cooling liquid supplied to the modular cooling unit is varied.

6. The liquid cooling apparatus of claim 1, wherein the cooling coils of the liquid-to-air heat exchangers from a plurality of adjacent ones of the modular cooling units are combined to remove heat from the airflow of a plurality of adjacent thermal loads.

7. The liquid cooling apparatus of claim 1, where the fluid distribution subsystem is further configured to supply the cooling liquid to a source of the thermal load to remove additional heat from the thermal load using a liquid-to-liquid heat exchanger and to return warm liquid from the liquid-to-liquid heat exchanger back to the cooling liquid source.

8. The liquid cooling apparatus of claim 7, where the cooling capacity of the cooling liquid supplied to the liquid cooling apparatus is further controlled based on a temperature of the warm liquid returned from the liquid-to-liquid heat exchanger.

9. A system of a data center, comprising:
   one or more rows of a plurality of electronic racks, each of the electronic racks housing a plurality of electronic components; and
   one or more rows of a row cooling unit, each row of the row cooling units is associated with a corresponding row of the electronic racks, wherein said row cooling unit includes:
      a plurality of interconnected modular cooling units, each of the modular cooling units having a fluid distribution subsystem configured to supply a cooling liquid received from a cooling liquid source to a liquid-to-air heat exchanger and to return warm liquid from the liquid-to-air heat exchanger back to the cooling liquid source; and
      a cooling coil of the liquid-to-air heat exchanger configured to receive the cooling liquid from the fluid distribution subsystem to remove heat from a corresponding one of the electronic racks carried by an airflow blown through the cooling coil, wherein a cooling capacity of the cooling liquid supplied to said row cooling unit is controlled based on a temperature of the airflow from said row cooling unit after the airflow of the corresponding row of the electronic racks transfers heat to the liquid-to-air heat exchanger, and wherein a layout of the system is configured so that the airflow from said row cooling unit flows in a same direction as an inlet airflow into an adjacent row of the electronic racks and its associated row cooling unit for an entire region or a portion of the data center.

10. The system of claim 9, wherein the cooling capacity of the cooling liquid supplied to said row cooling unit is controlled independently of a cooling capacity of the cooling liquid supplied to a second row cooling unit from the cooling liquid source.

11. The system of claim 9, wherein said row cooling unit and the corresponding row of the electronic racks comprises a point of delivery (PoD) of the data center, wherein the PoD comprises one of a compute PoD, a storage PoD, or a combination of the compute PoD and the storage PoD.

12. The system of claim 9, wherein the cooling coils is positioned higher than the corresponding row of the electronic racks.

13. The system of claim 9, wherein to control the cooling capacity of the cooling liquid supplied to said row cooling unit based on the temperature of the airflow from said row cooling unit after the heat is transferred by the liquid-to-air heat exchanger, a volume or a temperature of the cooling liquid supplied to said row cooling unit is varied.

14. The system of claim 9, wherein the cooling coils of the liquid-to-air heat exchangers from a plurality of adjacent ones of the modular cooling units are combined to remove heat from the airflow of a plurality of adjacent ones of the electronic racks.

15. The system of claim 9, wherein each of the electronic racks includes a rack manifold having a rack liquid supply line to a liquid-to-liquid heat exchanger and a rack liquid return line from the liquid-to-liquid heat exchanger, and wherein the fluid distribution subsystem is further configured to supply the cooling liquid to the rack liquid supply line of one of the electronic racks to remove additional heat from said electronic rack using the liquid-to-liquid heat exchanger and to return warm liquid from the liquid-to-liquid heat exchanger through the rack liquid return line back to the cooling liquid source.

16. The system of claim 15, where the cooling capacity of the cooling liquid supplied to said row cooling unit is further controlled based on a temperature of the warm liquid returned from the liquid-to-liquid heat exchanger.

17. The system of claim 9, wherein one of the electronic racks is configured to control an airflow in said electronic rack based on a temperature of the airflow in said electronic rack.

18. The system of claim 9, further comprising a plurality of rows of the electronic racks and a corresponding plurality of rows of the row cooling units that are arranged in an identical orientation in the data center.

19. The system of claim 9, further comprising a plurality of rows of the electronic racks and a corresponding plurality of rows of the row cooling units, wherein each pair of the plurality of row of the row cooling units are arranged to face one another.

20. The system of claim 9, further comprising a plurality of rows of the electronic racks and a corresponding plurality of rows of the row cooling units, wherein each of the row cooling units comprises an upper portion row cooling units and a lower portion row cooling units and wherein one or more of the upper portion row cooling units of the plurality of rows of the row cooling units are arranged in one orientation and one or more of the lower portion row cooling units of the plurality of rows of the row cooling units are arranged in an opposite orientation.

* * * * *